(12) United States Patent
Rao

(10) Patent No.: US 11,121,222 B2
(45) Date of Patent: Sep. 14, 2021

(54) SEMICONDUCTOR DEVICES WITH GRADED DOPANT REGIONS

(71) Applicant: GREENTHREAD, LLC, Dallas, TX (US)

(72) Inventor: G.R. Mohan Rao, Allen, TX (US)

(73) Assignee: GREENTHREAD, LLC, Dallas, TX (US)

( * ) Notice: Subject to any disclaimer, the term of this patent is extended or adjusted under 35 U.S.C. 154(b) by 0 days.

(21) Appl. No.: 16/947,294

(22) Filed: Jul. 27, 2020

(65) Prior Publication Data

US 2021/0005716 A1   Jan. 7, 2021

Related U.S. Application Data

(60) Continuation of application No. 16/717,950, filed on Dec. 17, 2019, now Pat. No. 10,734,481, which is a
(Continued)

(51) Int. Cl.
*H01L 29/10* (2006.01)
*H01L 27/11524* (2017.01)
(Continued)

(52) U.S. Cl.
CPC .... *H01L 29/1095* (2013.01); *H01L 27/11521* (2013.01); *H01L 27/11524* (2013.01);
(Continued)

(58) Field of Classification Search
CPC .................................................. H01L 29/1095
(Continued)

(56) References Cited

U.S. PATENT DOCUMENTS

| 4,001,864 A | 1/1977 | Gibbons |
| 4,160,985 A | 7/1979 | Kamins et al. |

(Continued)

FOREIGN PATENT DOCUMENTS

| JP | s6482563 A | 3/1989 |
| JP | 2003051551 A | 2/2003 |

(Continued)

OTHER PUBLICATIONS

P.D. Moor, Advanced CMOS-based pixel sensors, https://indico.cem.ch/event/122027/contributions/88236/attachments/69340/99377/FEEimecPdM.pdf, 2011, 41 pages.
(Continued)

*Primary Examiner* — Ajay Arora
(74) *Attorney, Agent, or Firm* — Gregory M. Howison

(57) ABSTRACT

Most semiconductor devices manufactured today, have uniform dopant concentration, either in the lateral or vertical device active (and isolation) regions. By grading the dopant concentration, the performance in various semiconductor devices can be significantly improved. Performance improvements can be obtained in application specific areas like increase in frequency of operation for digital logic, various power MOSFET and IGBT ICs, improvement in refresh time for DRAMs, decrease in programming time for nonvolatile memory, better visual quality including pixel resolution and color sensitivity for imaging ICs, better sensitivity for varactors in tunable filters, higher drive capabilities for JFETs, and a host of other applications.

44 Claims, 10 Drawing Sheets

CMOS Substrate for a DRAM or image sensor, with one embodiment of the invention

Related U.S. Application Data continuation of application No. 15/590,282, filed on May 9, 2017, now Pat. No. 10,510,842, which is a continuation of application No. 14/931,636, filed on Nov. 3, 2015, now Pat. No. 9,647,070, which is a continuation of application No. 14/515,584, filed on Oct. 16, 2014, now Pat. No. 9,190,502, which is a continuation of application No. 13/854,319, filed on Apr. 1, 2013, now abandoned, which is a continuation of application No. 11/622,496, filed on Jan. 12, 2007, now Pat. No. 8,421,195, which is a division of application No. 10/934,915, filed on Sep. 3, 2004, now abandoned.

(51) Int. Cl.
*H01L 27/146* (2006.01)
*H01L 27/11521* (2017.01)
*H01L 29/739* (2006.01)
*H01L 29/36* (2006.01)
*H01L 27/02* (2006.01)
*H01L 27/108* (2006.01)

(52) U.S. Cl.
CPC ........ *H01L 27/14643* (2013.01); *H01L 29/36* (2013.01); *H01L 29/7395* (2013.01); *H01L 27/0214* (2013.01); *H01L 27/10844* (2013.01)

(58) Field of Classification Search
USPC .......................................................... 257/25
See application file for complete search history.

(56) References Cited

U.S. PATENT DOCUMENTS

| | | |
|---|---|---|
| 4,347,654 A | 9/1982 | Allen et al. |
| 4,481,522 A | 11/1984 | Jastrzebski et al. |
| 4,684,971 A | 8/1987 | Payne |
| 4,688,063 A | 8/1987 | Lu et al. |
| 4,866,000 A | 9/1989 | Okita |
| 4,907,058 A | 3/1990 | Sakai |
| 4,994,887 A | 2/1991 | Hutter et al. |
| 5,029,277 A | 7/1991 | Kane |
| 5,130,262 A | 7/1992 | Masquelier et al. |
| 5,213,988 A | 5/1993 | Yamauchi et al. |
| 5,262,345 A | 11/1993 | Nasser et al. |
| 5,329,144 A | 7/1994 | Luryi |
| 5,448,087 A | 9/1995 | Streit et al. |
| 5,480,816 A | 1/1996 | Uga et al. |
| 5,496,746 A | 3/1996 | Matthews |
| 5,517,052 A | 5/1996 | Ishaque |
| 5,569,612 A | 10/1996 | Frisina et al. |
| 5,575,862 A | 11/1996 | Nishida |
| 5,637,898 A | 6/1997 | Baliga |
| 5,797,999 A | 8/1998 | Sannomiya et al. |
| 5,835,402 A | 11/1998 | Rao et al. |
| 5,888,857 A | 3/1999 | Zhang et al. |
| 5,973,575 A | 10/1999 | Kamogawa et al. |
| 6,025,237 A | 2/2000 | Choi |
| 6,211,028 B1 | 4/2001 | Tsai et al. |
| 6,310,366 B1 | 10/2001 | Rhodes et al. |
| RE37,441 E | 11/2001 | Yamazaki |
| 6,384,431 B1 | 5/2002 | Takahashi et al. |
| 6,452,086 B1 | 9/2002 | Muller |
| 6,465,862 B1 | 10/2002 | Harris |
| 6,472,715 B1 | 10/2002 | Liu et al. |
| 6,670,544 B2 | 12/2003 | Kibbel et al. |
| 6,683,343 B2 | 1/2004 | Matsudai et al. |
| 6,696,314 B2 | 2/2004 | Rhodes |
| 6,706,550 B2 | 3/2004 | Lee et al. |
| 6,713,813 B2 | 3/2004 | Marchant |
| 6,720,622 B1 | 4/2004 | Yu |
| 6,737,722 B2 | 5/2004 | Yamamoto et al. |
| 6,744,117 B2 | 6/2004 | Dragon et al. |
| 6,747,883 B2 | 6/2004 | Yasumura |
| 6,753,202 B2 | 6/2004 | Chen et al. |
| 6,754,093 B2 | 6/2004 | Lien |
| 6,756,616 B2 | 6/2004 | Rhodes |
| 6,780,713 B2 | 8/2004 | Bromberger et al. |
| 6,831,292 B2 | 12/2004 | Currie et al. |
| 6,878,603 B2 | 4/2005 | Bromberger et al. |
| 6,921,946 B2 | 7/2005 | Kenney et al. |
| 6,933,215 B2 | 8/2005 | Bromberger et al. |
| 7,064,385 B2 | 6/2006 | Dudek et al. |
| 7,115,925 B2 | 10/2006 | Rhodes |
| 7,233,044 B2 | 6/2007 | Dudek |
| 7,307,327 B2 | 12/2007 | Bahl et al. |
| 7,504,692 B2 | 3/2009 | Dudek et al. |
| 8,164,124 B2 | 4/2012 | Liu et al. |
| 8,421,195 B2 | 4/2013 | Rao |
| 9,190,502 B2 | 11/2015 | Rao |
| 9,647,070 B2 | 5/2017 | Rao |
| 10,510,842 B2 | 12/2019 | Rao |
| 10,734,481 B2 | 8/2020 | Rao |
| 2001/0028097 A1 | 10/2001 | Matsuoka et al. |
| 2001/0040622 A1 | 11/2001 | Maruyama |
| 2002/0056883 A1 | 5/2002 | Baliga |
| 2002/0074585 A1 | 6/2002 | Tsang et al. |
| 2002/0084430 A1 | 7/2002 | Bamji et al. |
| 2002/0093281 A1 | 7/2002 | Cathey |
| 2002/0102783 A1 | 8/2002 | Fujimoto et al. |
| 2002/0134419 A1 | 9/2002 | Macris |
| 2002/0195656 A1 | 12/2002 | Hattori |
| 2003/0026126 A1 | 2/2003 | Uemura |
| 2003/0030488 A1 | 2/2003 | Hueting et al. |
| 2003/0042511 A1 | 3/2003 | Rhodes |
| 2003/0183856 A1 | 10/2003 | Wieczorek |
| 2004/0027753 A1 | 2/2004 | Friedrichs et al. |
| 2004/0063288 A1 | 4/2004 | Kenney et al. |
| 2006/0113592 A1 | 6/2006 | Pendharkar et al. |
| 2007/0045682 A1* | 3/2007 | Hong ................ H01L 27/14689 257/292 |
| 2008/0142899 A1 | 6/2008 | Morris |
| 2012/0048462 A1 | 3/2012 | Lee |
| 2013/0001661 A1 | 1/2013 | Mao et al. |
| 2014/0034997 A1* | 2/2014 | Rahimo ................ H01L 29/861 257/139 |
| 2015/0200314 A1 | 7/2015 | Webster |
| 2017/0243876 A1 | 8/2017 | Rao |

FOREIGN PATENT DOCUMENTS

| | | |
|---|---|---|
| JP | 2003218356 A | 7/2003 |
| WO | 2004049453 A1 | 6/2004 |

OTHER PUBLICATIONS

E. Parton, CMOS Sensors, Laser Focus World, http://www.laserfocusworld.com/articles/print/volume-49/issue-10/features/cmos-sensors-cmos-based-specialty-imagers-reach-new-performance-levels.html, Oct. 14, 2013, 5 pages.

Z. Cao, Design of Pixel for High Speed CMOS Image Sensors, http://www.imagesensors.org/Past%20Workshops/2013%20Workshop/2013%20Papers/07-11_072-Cao_papers.pdf, 4 pages.

M. Tanenbaum, BSTJ: Diffused Emitter and Base Silicon Transisters, The Bell System Technical Journal, Jan. 1956, 22 pages, vol. XXXV, https://archive.org/details/bstj35-1-1.

IMEC Image Sensors and Vision Systems, http:www2.imec.be/content/user/File/Brochures/cmos%20imagers%20brochure-april26.pdf, Apr. 2014, 2 pages.

A.S. Grove, Physics and Technology of Semiconductor Devices, John Wiley Sons, Inc., New York, Nov. 1967.

W. Murray Bullis and W. R. Runyan, Influence of Mobility and Lifetime Variations on Drift-Field Effects in Silicon-Junction Devices, IEEE Transactions on Electron Devices, vol. Ed-14, No. 2, Feb. 1967.

Berinder Brar et al., Herb's Bipolar Transistors, IEEE Transactions on Electron Devices, vol. 48, No. 11, Nov. 2001.

IPR2020-00288—Exhibit 1029—Claim Construction District Court 4 20-2020.

(56) References Cited

OTHER PUBLICATIONS

IPR2020-00288—Exhibit 2007—Minutes for Markman Hearing Held via Video Conference Before U.S. District Judge Rodney Gilstrap, *Greenthread, LLC* v. *Samsung Electronics Co., Ltd., et al.*, Case No. 2:19-CV-147-JRG, Dkt. 61.
IPR2020-00288—Petitioner Reply.
IPR2020-00289-00289 Petitioner Reply.
IPR2020-00292—Petition for IPR.
IPR2020-00292—Exhibit 2002—Excerpt from Exhibit 4 to Appendix B of Samsung Electronics Co., Ltd.'s Invalidity Contentions (Invalidity Contention based on U.S. Pat. No. 6,384,431 to Takahashi.
IPR2020-00288—Ex. 1020—Michael Nastasi and James W. Mayer, Ion Implantation and Synthesis of Materials (2006). 4 pages.
IPR2020-00288—Exhibit 2001—IPR2020-00288—Excerpt from Exhibit 1 to Appendix A of Samsung Electronics Co., Ltd.'s Invalidity Contentions regarding Morris.
IPR2020-00288—Exhibit 2002—xcerpt from Exhibit 2 to Appendix A of Samsung Electronics Co., Ltd.'s Invalidity Contentions regarding Miyamoto.
IPR2020-00288—Exhibit 2009—Complaint for Patent Infringement, *Greenthread, LLC* v. *Samsung Electronics Co., Ltd., et al.*, Case No. 2:19-CV-147-JRG, Dkt. 1.
IPR2020-00288—Exhibit 2011—Exhibit A to Revised Joint Claim Construction Chart Pursuant to Patent Rule 4-5, *Greenthread, LLC* v. *Samsung Electronics Co., Ltd., et al.*, Case No. 2:19-CV-147-JRG, Dkt. 60-1.
IPR2020-00288—Exhibit 2012—Samsungs Responsive Claim Construction Brief—District Court.
IPR2020-00288—Exhibit 2013—Glew Dec.
IPR2020-00288—Exhibit 2014—Excerpt from Exhibit 10 to Appendix A of Samsung Electronics Co., Ltd.'s Invalidity Contentions.
IPR2020-00288—Patent Owner Preliminary Response.
IPR2020-00288—Patent Owner Sur Reply.
IPR2020-00288—Petition.
IPR2020-00289—Exhibit 1 to Appendix C of Samsung Electronics Co., Ltd.'s Invalidity Contentions regarding Payne.
IPR2020-00289—Exhibit 1003—Smith Dec.
IPR2020-00289—Exhibit 1010—S. M. Sze et al., Semiconductor Devices: Physics and Technology, John Wiley & Sons, 2nd Ed., 2002 ("Sze '02").
IPR2020-00289—Exhibit 1012—Ben G. Streetman, Solid State Electronic Devices, 2nd Ed., Prentice-Hall, 1980 ("Streetman").
IPR2020-00289—Exhibit 2001—Exhibit 1 to Appendix C of Samsung Electronics Co., Ltd.'s Invalidity Contentions regarding Payne.
IPR2020-00289—Exhibit 2002—Exhibit 3 to Appendix C of Samsung Electronics Co., Ltd.'s Invalidity Contentions regarding Wieczorek.
IPR2020-00289—Exhibit 2011—Behzad Razavi, Design of Analog CMOS Integrated Circuits, 2001 ("Razavi").
IPR2020-00289—Exhibit 2012—Excerpts from Wolf, S., Silicon Processing for the VLSI Era, vol. 4—Deep-Submicron Process Technology (2002) ("Wolf vol. 4").
IPR2020-00289—Exhibit 2013—Glew Dec.
IPR2020-00289—Patent Owner Pre Resp.
IPR2020-00289—Patent Owner Sur reply.
IPR2020-00289—Petition.
IPR2020-00290—Exhibit 1003—Declaration of Dr. Bruce Smith.
IPR2020-00290—Exhibit 1013—Tango, Mega bit Memory Technology.
IPR2020-00290—Patent Owner Preliminary Resp.
IPR2020-00290—Patent Owner Sur Reply.
IPR2020-00290—Petition.
IPR2020-00290—Petitioners Reply to Patent Owner Preliminary Response.
IPR2020-00291—Exhibit 1003—Declaration of Dr. Bruce Smith.
IPR2020-00291—Exhibit 1011—The Insulated Gate Bipolar Transistor: IGBT Theory and Design, Vinod Kumar Khanna, IEEE Press and Wiley-Interscience, 2003.
IPR2020-00291—Exhibit 1020—S. M. Sze, Physics of Semiconductor Devices, Wiley-Interscience, 2nd Ed., 1981 ("Sze 81").
IPR2020-00291—Exhibit 1021—S. M. Sze, Semiconductor Devices: Physics and Technology, John Wiley & Sons, 2nd Ed., 2002 ("Sze '02").
IPR2020-00291—Exhibit 2001—Exhibit 2 to Appendix B of Samsung Electronics Co., Ltd's Invalidity Contentions (Invalidity Contention based on U.S Patent Application Publication No. 2002/0195656 ("Hattori")).
IPR2020-00291—Exhibit 2013—Declaration of Dr. Alexander D. Glew.
IPR2020-00291—Patent Owner Preliminary Resp.
IPR2020-00291—Patent Owner Sur Reply.
IPR2020-00291—Petition.
IPR2020-00291—Petitioners Reply.
IPR2020-00292—Exhibit 1003—Declaration of Dr. Bruce Smith.
IPR2020-00292—Exhibit 2001—Excerpt from Exhibit 1 to Appendix B of Samsung Electronics Co., Ltd.'s Invalidity Contentions (Invalidity Contention based on "Insulated Gate Bipolar Transistor IGBT Theory and Design" by Vinod Kumar Khanna.
IPR2020-00292—Exhibit 2012—Excerpt from Exhibit A to Joint Claim Construction Chart Pursuant to Patent Rule 4-5, *Greenthread, LLC* v. *Samsung Electronics Co., Ltd., et al.*, Case No. 2:19-CV-147-JRG, Dkt. 53-1 (Mar. 18, 2020).
IPR2020-00292—Patent Owner Preliminary Response.

\* cited by examiner

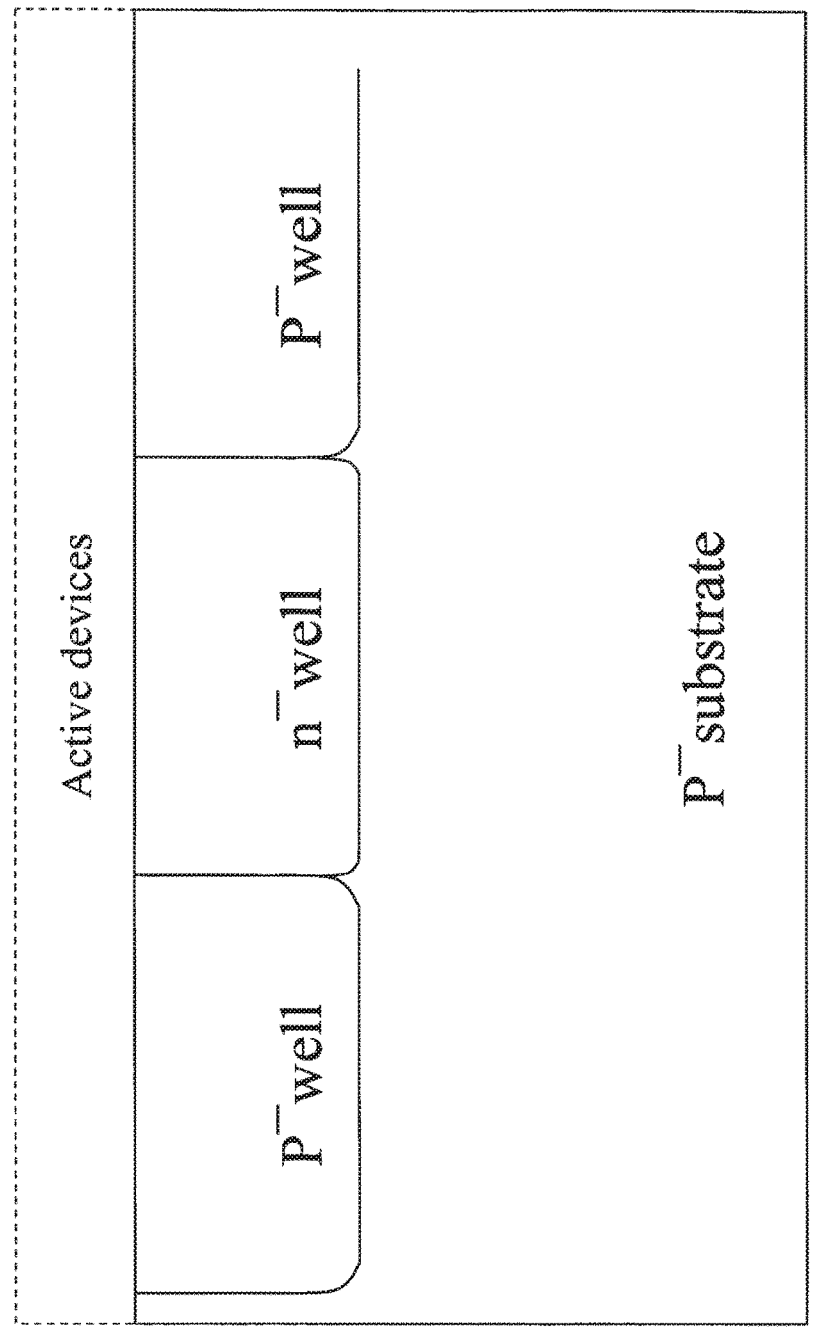
FIGURE 3A Prior art (Twin well CMOS) for a CMOS integrated circuit

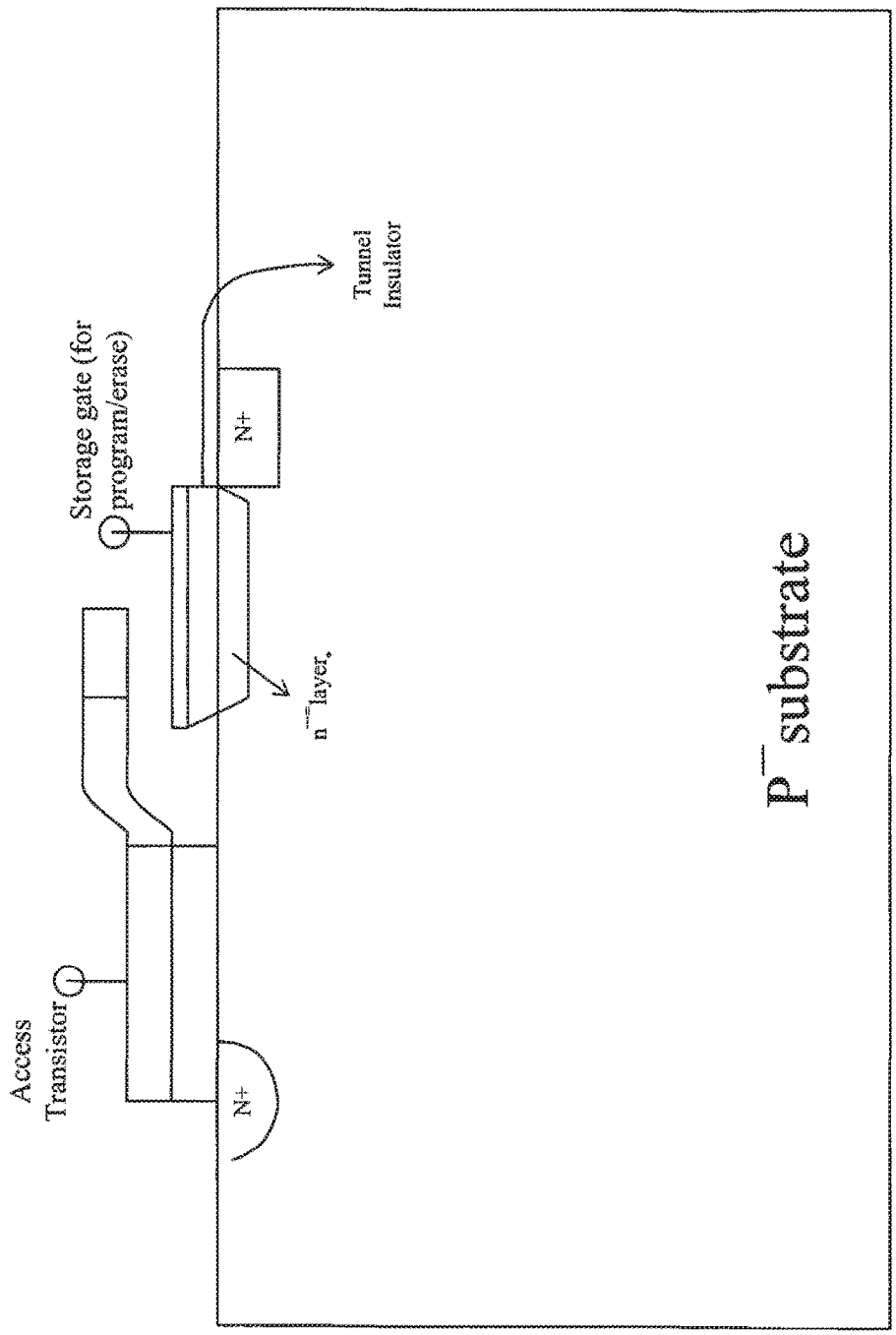
FIGURE 3B   Prior art for a two-device EEPROM memory cell

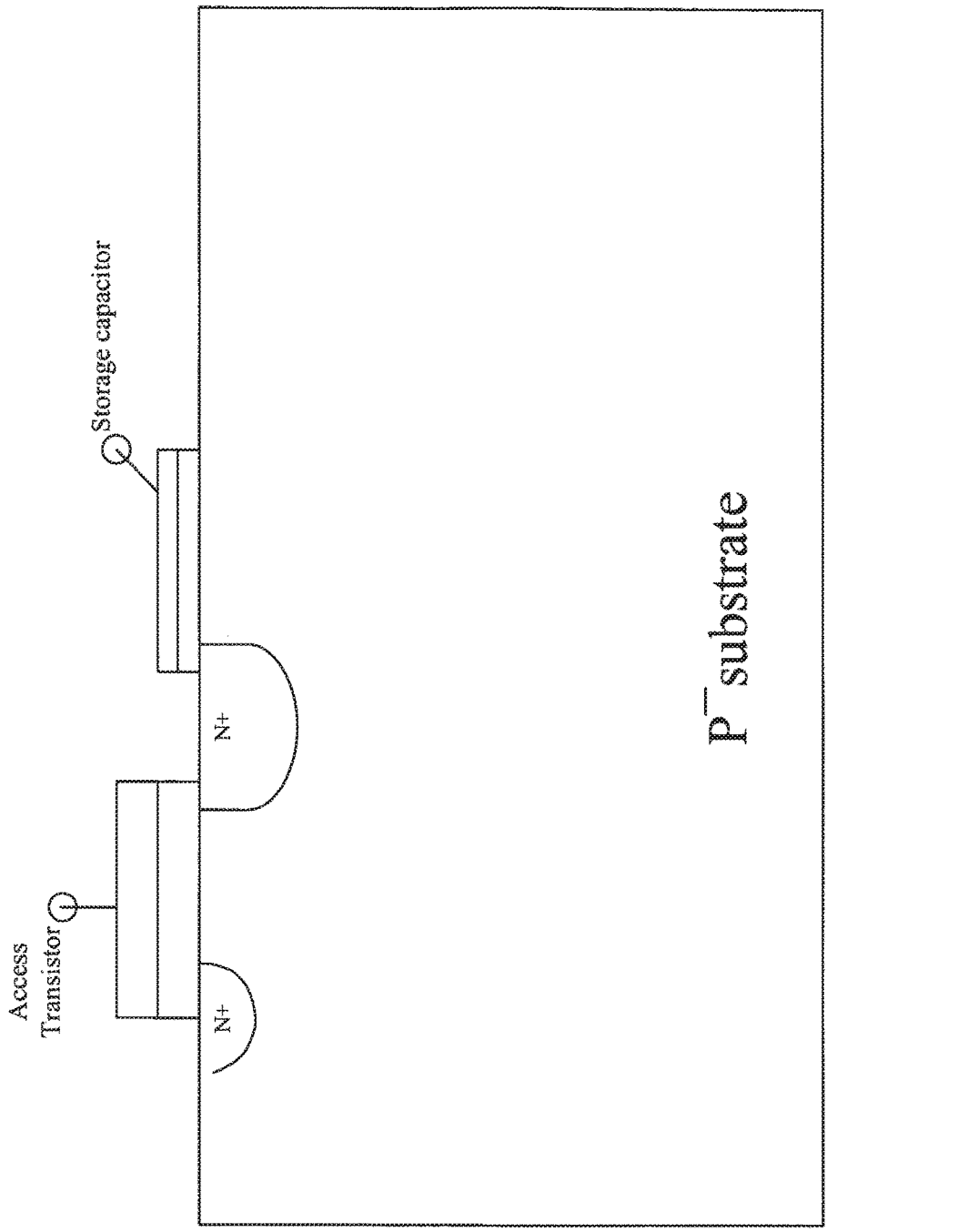
FIGURE 3C  Prior art for a 1T-1C DRAM memory cell

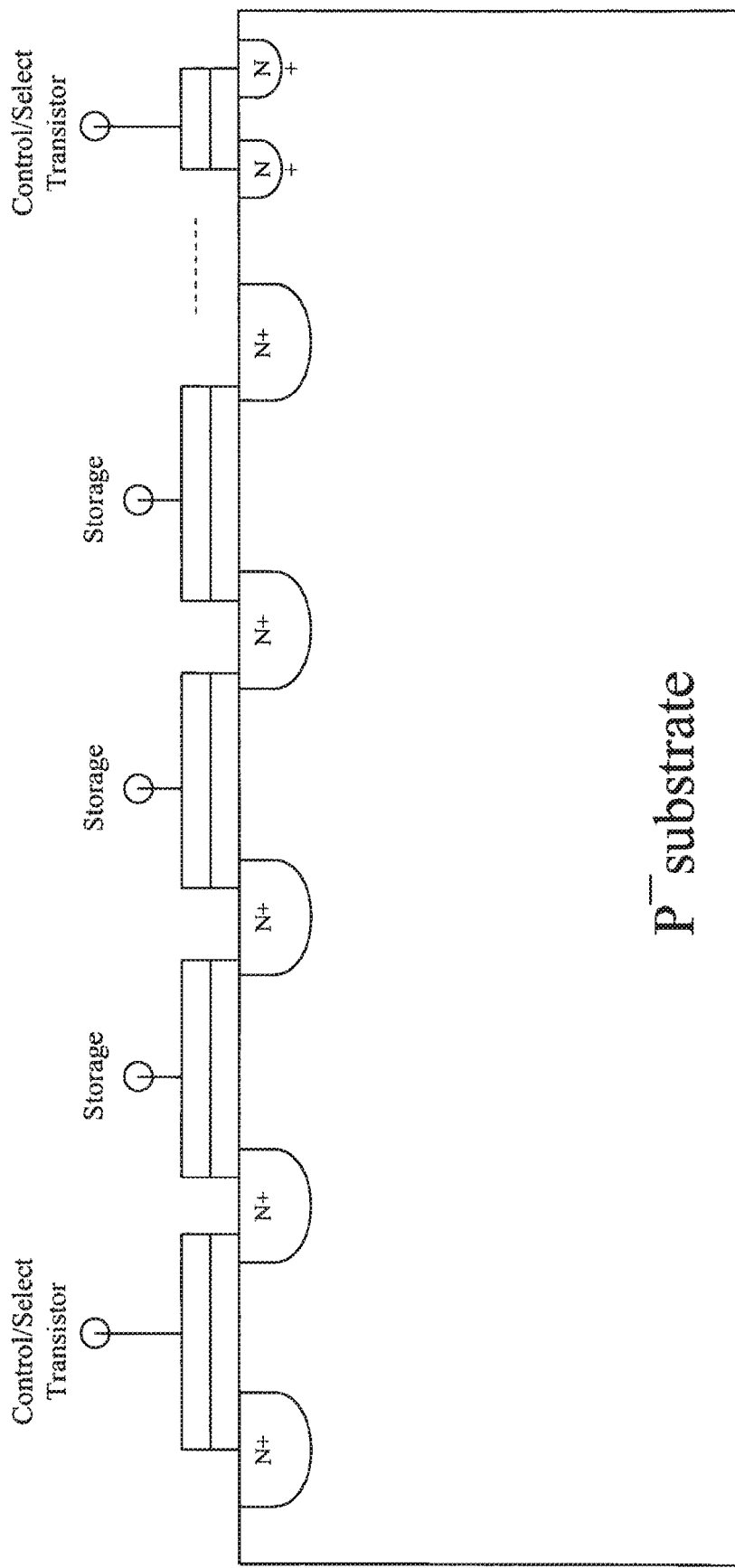
FIGURE 3D Prior art for a NAND flash memory cell
Note: Control/Sect transistors have a single insulator - traditional MOS transistor.
Storage nodes have a stacked gate structure, typically with a floating gate and control gate comprising the stack.

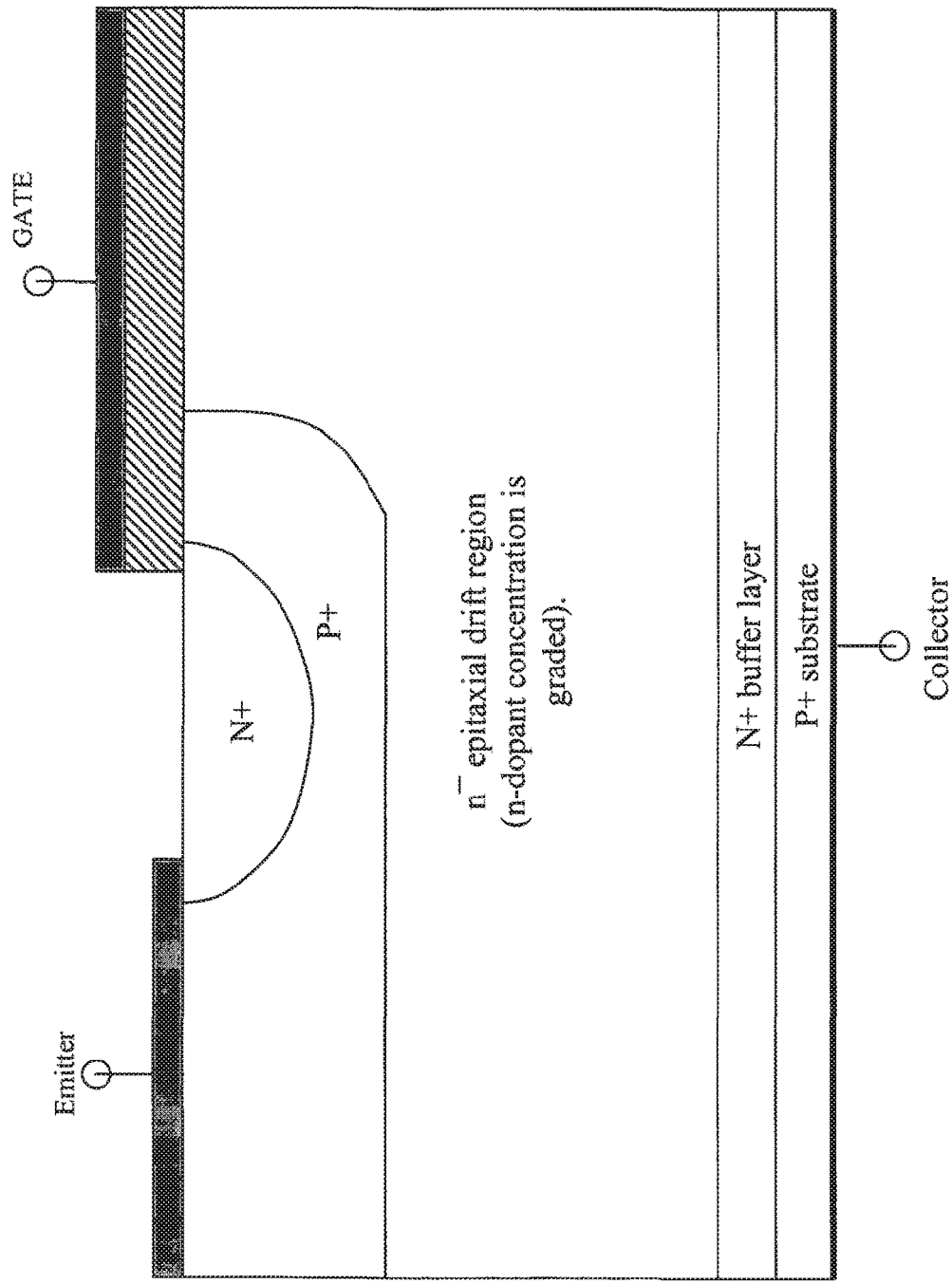
FIGURE 4 A dopant – concentration grinded drift region in a IGBT

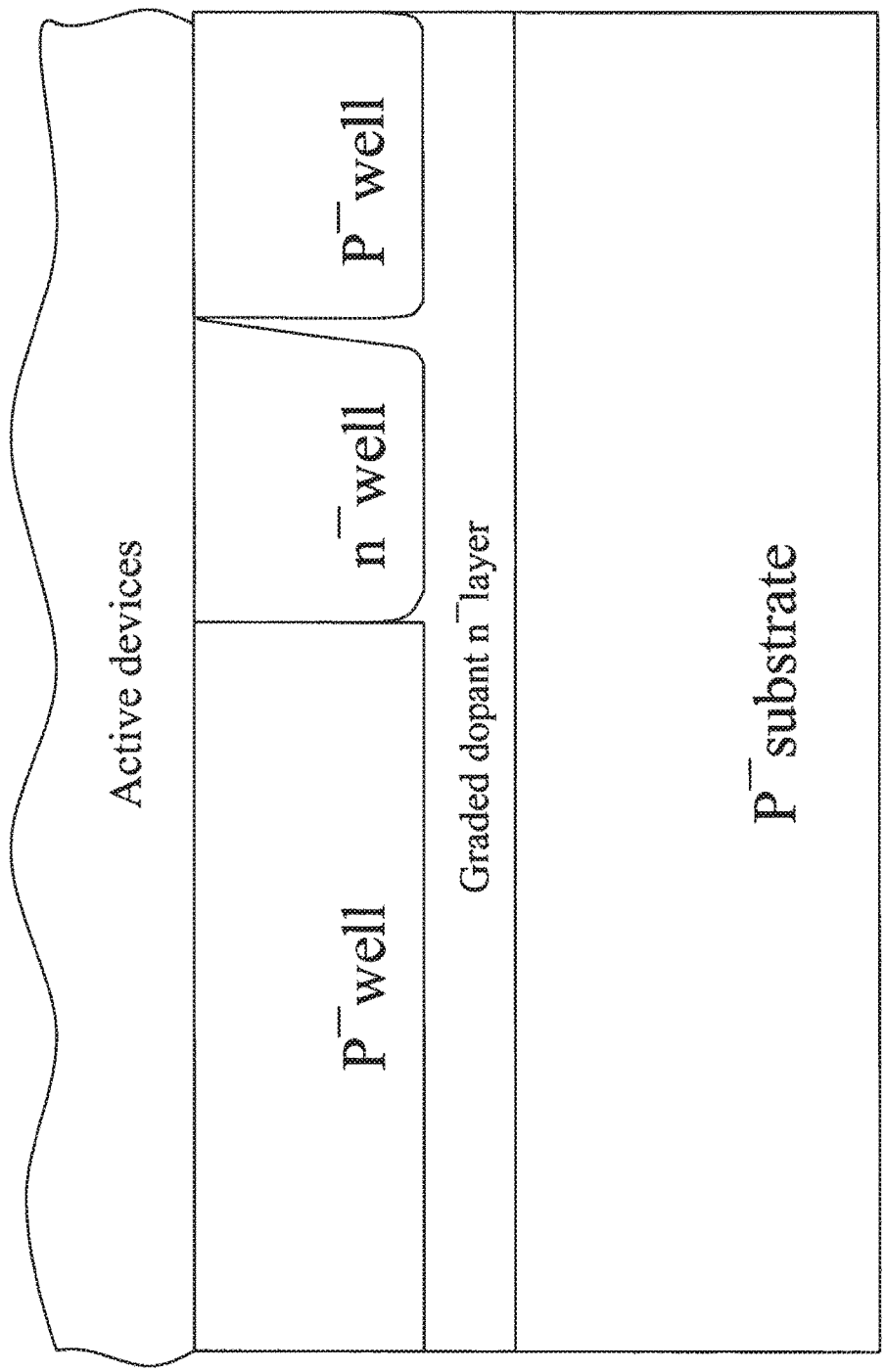
FIGURE 5A  A CMOS Substrate for digital, mixed, signal, and senors IC's

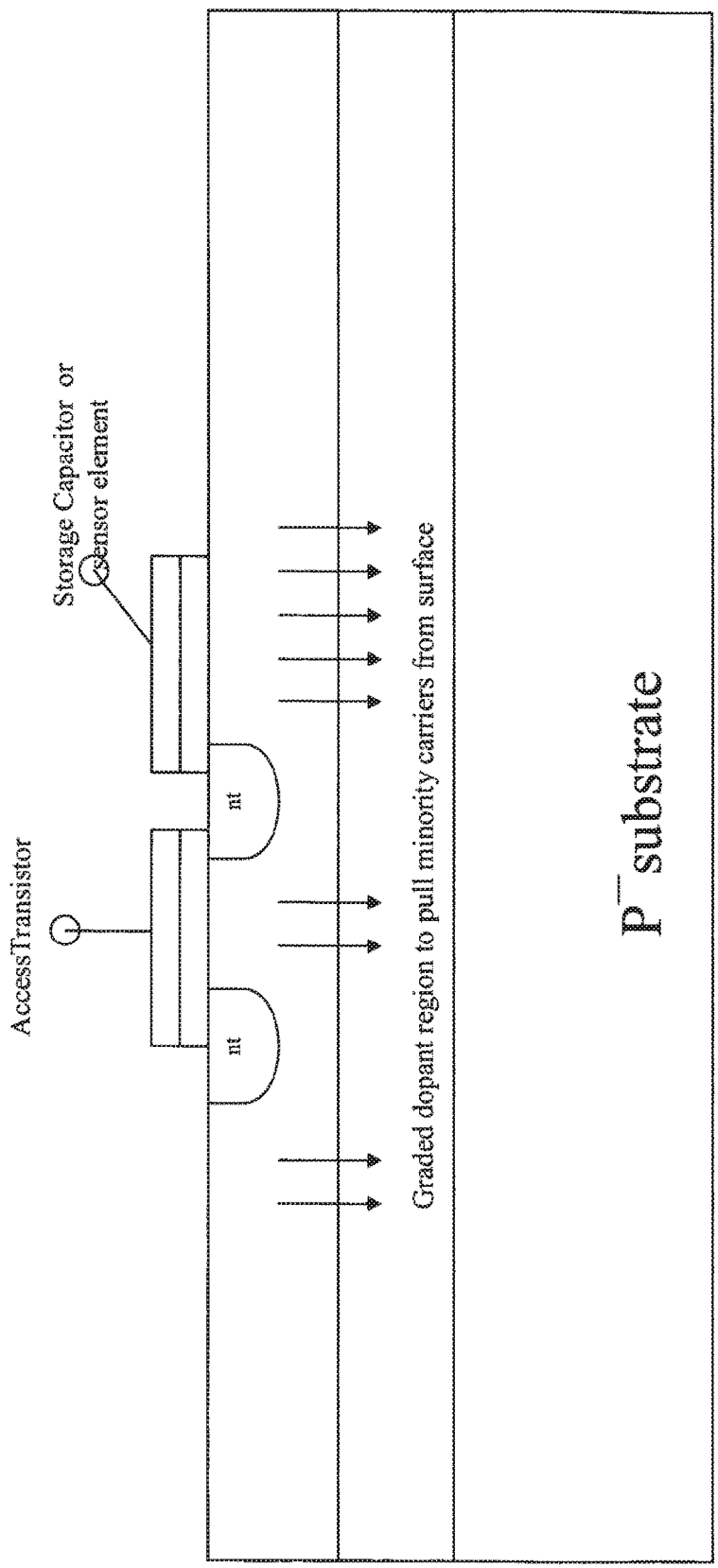

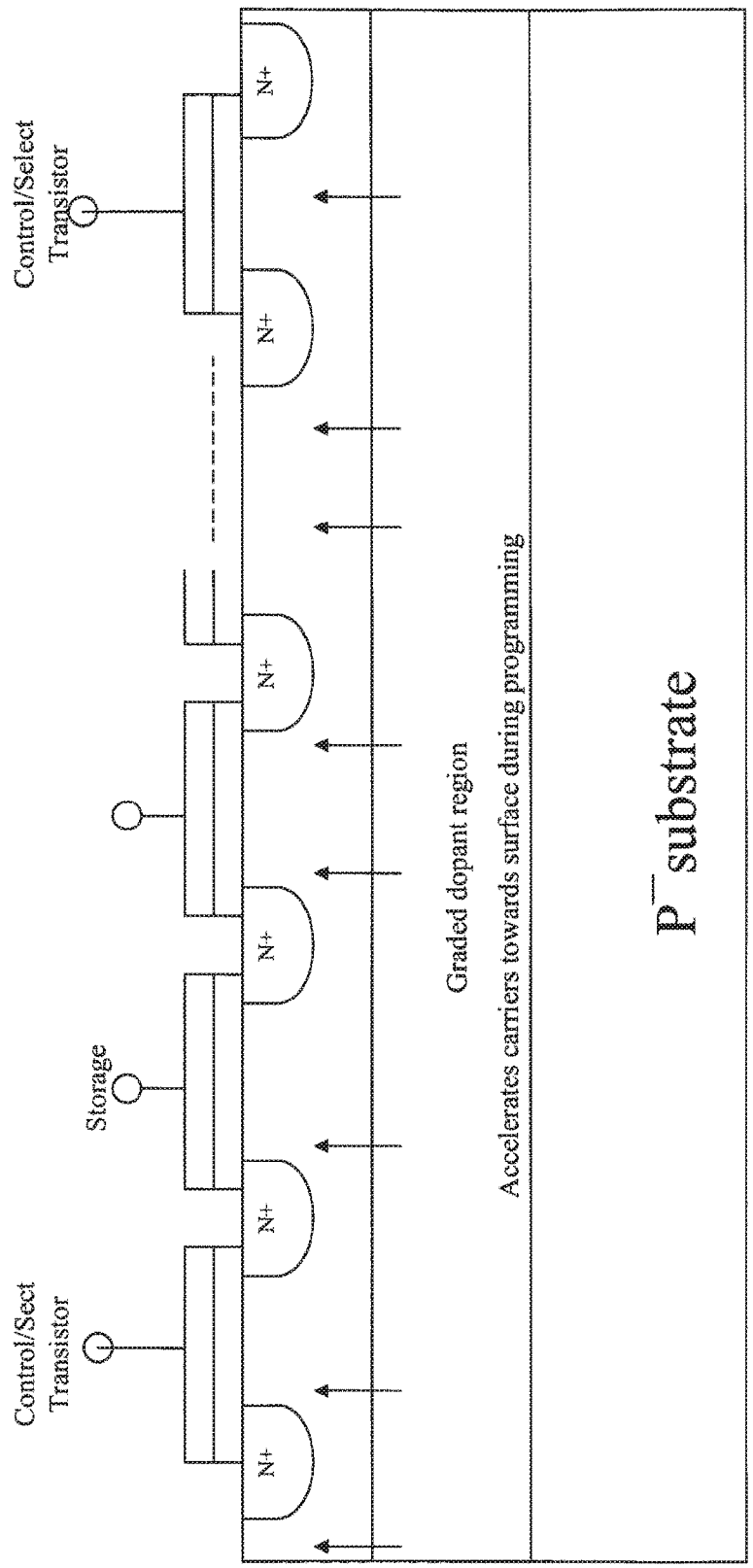
FIGURE 5C    CMOS Substrate for a NAND flash device to improve programming times

SEMICONDUCTOR DEVICES WITH GRADED DOPANT REGIONS

CROSS-REFERENCE TO RELATED APPLICATIONS

This application is a Continuation of U.S. patent application Ser. No. 16/717,950, filed Dec. 17, 2019, which this a Continuation of U.S. patent application Ser. No. 15/590,282, filed May 9, 2017, which is a Continuation of U.S. patent application Ser. No. 14/931,636, filed Nov. 3, 2015, which is Continuation of U.S. patent application Ser. No. 14/515,584, filed Oct. 16, 2014, which is a Continuation of U.S. patent application Ser. No. 13/854,319 filed Apr. 1, 2013, which is a Continuation of Ser. No. 11/622,496, filed Jan. 12, 2007, which is a Divisional of U.S. patent application Ser. No. 10/934,915, filed Sep. 3, 2004. The disclosures of which are incorporated herein by reference in their entirety.

TECHNICAL FIELD

This present invention relates to all semiconductor devices and systems. Particularly it applies to diffused diodes, avalanche diodes, Schottky devices, power MOS transistors, JFET's, RF bipolar transistors, IGBTs (Insulated Gate Bipolar Transistors), varactors, digital VLSI, mixed signal circuits and sensor devices including camera ICs employing CCD (Charge Coupled Device) as well as CMOS technologies.

BACKGROUND

Bipolar Junction Transistors (BJT) are classified as minority carrier devices because minority carriers are the principle device conduction mechanism. However, majority carriers also play a small but finite role in modulating the conductivity in BJTs. Consequently, both carriers (electrons and holes) play a role in the switching performance of BJTs. The maximum frequency of operation in BJTs is limited by the base transit time as well as the quick recombination of the majority carriers when the device is switched off (prior to beginning the next cycle). The dominant carrier mechanism in BJTs is carrier diffusion. The carrier drift current component is fairly small, especially in uniformly doped base BJTs. Efforts have been made in graded base transistors to create an aiding drift field to enhance the diffusing minority carrier's speed from emitter to collector. However, most semiconductor devices, including various power MOSFETs (traditional, DMOS, lateral, vertical and a host of other configurations), IGBT's (Insulated Gated Base Transistors), still use a uniformly doped 'drift epitaxial' region in the base. FIG. 1 shows the relative doping concentration versus distance in a BJT. FIG. 2 shows the uniformly doped epi region in an IGBT. In contrast to BJTs, MOS devices are majority carrier devices for conduction. The conduction is channel dominated. The channel can be a surface in one plane in planar devices. The surface can also be on the sidewalls in a vertical device. Other device architectures to combine planar and vertical conductions are also possible. The maximum frequency of operation is dictated primarily by source-drain separation distance. Most MOS devices use a uniformly doped substrate (or a well region). When a MOSFET is optimally integrated with a BJT in a monolithic fashion, an IGBT results. The IGBT inherits the advantages of both MOSFET and BJT. It also brings new challenges because the required characteristics (electron transit and hole recombination as fast as possible in n-channel IGBT) necessitate different dopant gradients either in the same layer at different positions, or at the interfaces of similar or dissimilar layers.

Retrograde wells have been attempted, with little success, to help improve soft error immunity in SRAMs and visual quality in imaging circuits. FIG. 3A shows a typical CMOS VLSI device employing a twin well substrate, on which active devices are subsequently fabricated. FIGS. 3B, 3C, and 3D illustrate device cross sections, as practiced today. Retrograde and halo wells have also been attempted to improve refresh time in DRAMs (dynamic random-access memories), as well as, reducing dark current (background noise) and enhance RGB (Red, Green, Blue) color resolution in digital camera ICs. Most of these techniques either divert the minority carriers away from the active regions of critical charge storage nodes at the surface, or, increase minority carrier density locally as the particular application requires.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3A, 3B, 3C, and 3D illustrate cross sections of commonly used prior art CMOS silicon substrates; FIG. 3A showing a typical prior art IC with two wells (one n⁻well in which p-channel transistors are subsequently fabricated and one p⁻well in which n-channel transistors are subsequently fabricated); FIG. 3B showing a prior art EEPROM (Electronically Erasable Programmable Read-Only Memory) memory cell having a tunnel insulator; FIG. 3C showing a prior art DRAM memory cell; and FIG. 3D showing a prior art NAND flash memory cell;

FIG. 4 illustrates the cross section of an IGBT, using one embodiment of the invention described here, where the dopant is optimally graded in the epitaxial drift region; and FIGS. 5A, 5B, and 5C illustrate the cross sections of a CMOS silicon substrate with two wells and an underlying layer using embodiments of the invention to improve performance in each application—VLSI logic, DRAM/image IC, nonvolatile memory IC.

DETAILED DESCRIPTION

Figure 1:
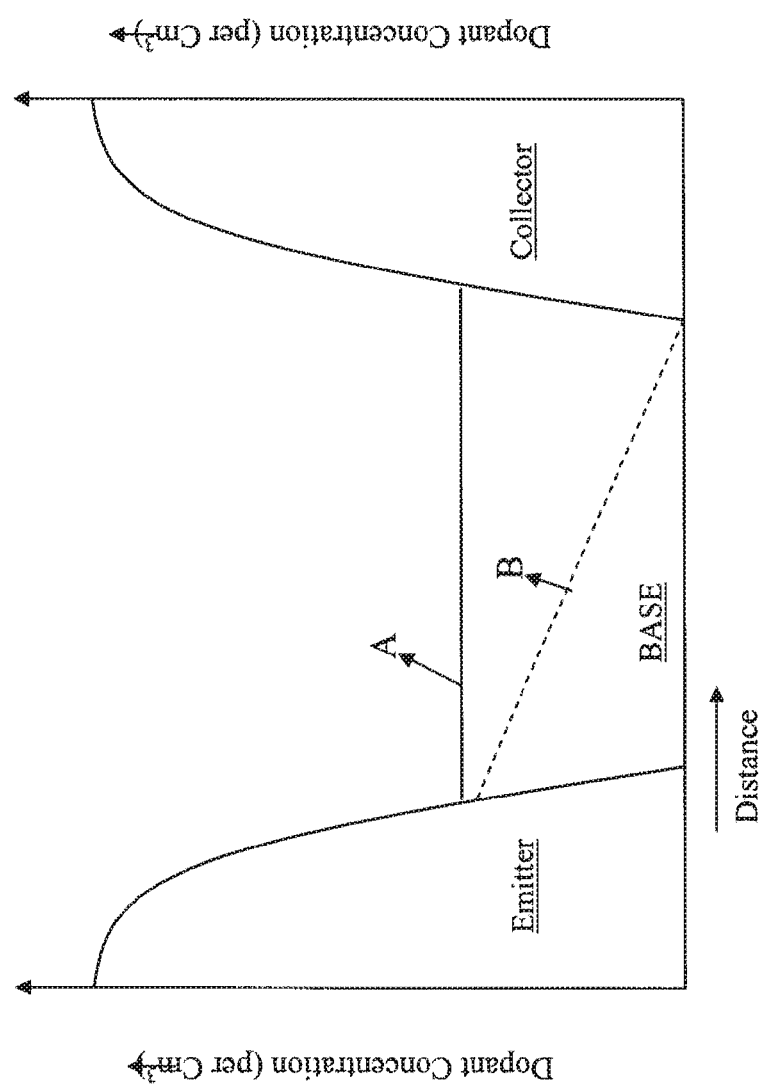
FIG. 1 illustrates the relative doping profiles of emitter, base and collector for the two most popular bipolar junction transistors: namely, uniform base ("A") and graded base ("B")
Figure 2:
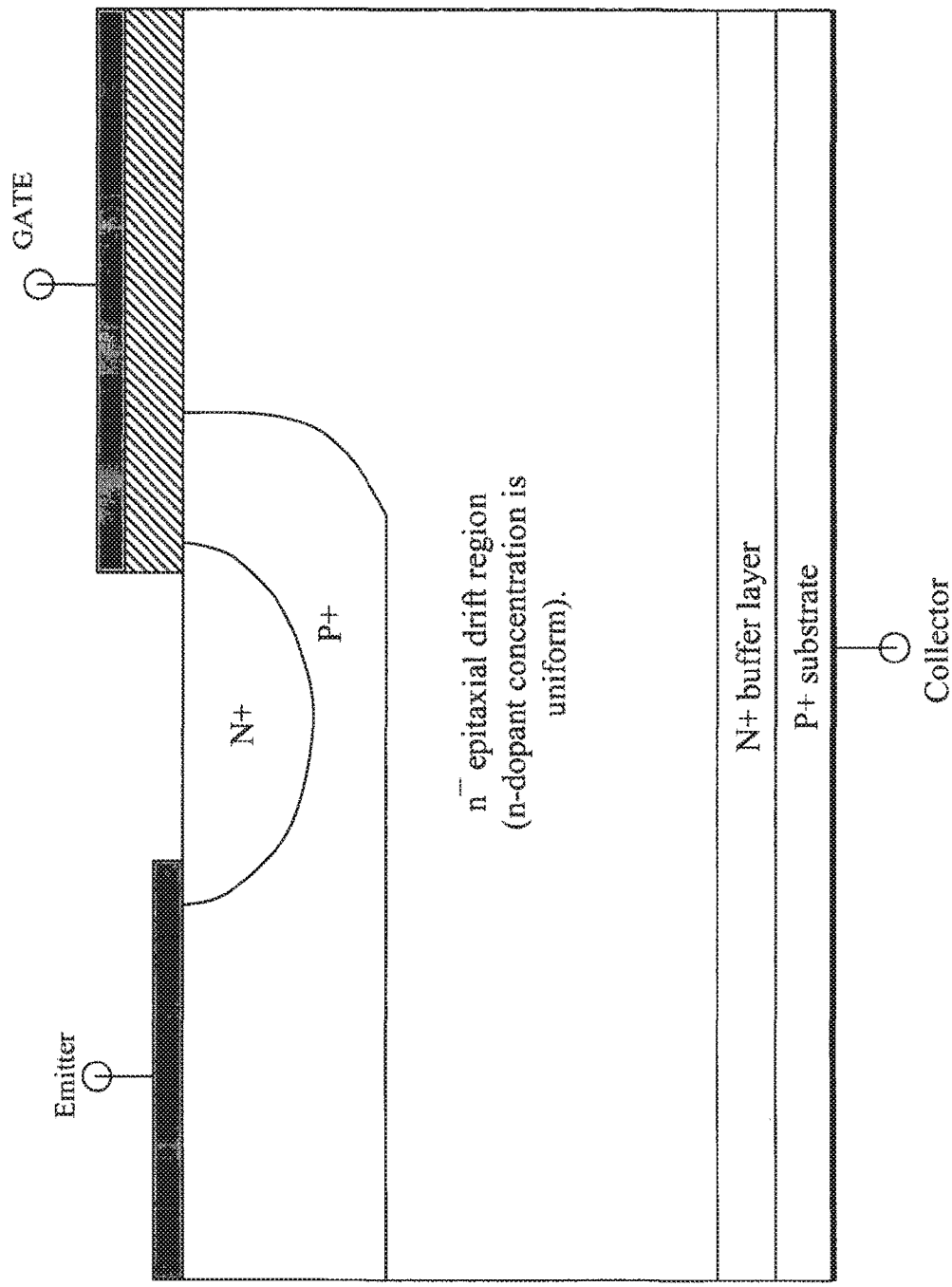
FIG. 2 illustrates the cross section of a commercial IGBT with a uniform epitaxial drift region (base)

The relative doping concentrations of emitter and collector regions varies from $10^{18}$ to $10^{20}/cm^3$, whereas the base region is $10^{14}$ to $10^{16}/cm^3$ depending on the desired characteristics of the BJT. In graded base p-n-p transistors, the donor dopant concentration may be 10 to 100× at the emitter-base junction, relative to the base-collector junction (1×). The gradient can be linear, quasi linear, exponential or complimentary error function. The relative slope of the donor concentration throughout the base creates a suitable aiding drift electric field, to help the holes (p-n-p transistor) transverse from emitter to collector. Since the aiding drift electric field helps hole conduction, the current gain at a given frequency is enhanced, relative to a uniformly-doped (base) BJT. The improvement in cut-off frequency (or, frequency at unity gain, $f_T$) can be as large as 2x-5x. Similar performance improvements are also applicable to n-p-n transistors.

As illustrated in FIG. 4, in one embodiment according to the invention, a donor gradient is established from the emitter-drift epitaxial base region junction of the punch-through IGBT, to the drift epitaxial base region—$n^+$ buffer layer boundary (electrons in this case are accelerated in their transit from emitter to collector). The "average" base resistance is optimized so that conductivity modulation and lifetime (for minority carriers) in the base region are not compromised. By sweeping the carriers towards the $n^+$ buffer region a number of advantages are obtained. First, the frequency of operation (combination of $t_{on}$ and $t_{off}$ as is known in the IGBT commercial nomenclature) can be enhanced. Second, and maybe more importantly, during $t_{off}$, holes can be recombined much quicker at the $n^+$ buffer layer, compared to the uniformly doped $n^-$ epitaxial drift region by establishing a different dopant gradient near the $n^+$ buffer layer. It should be noted that the drift region can also be a non-epitaxial silicon substrate. Although epitaxy enhances lifetime, it is not mandatory. Different layers of dopant regions can be transferred through wafer to wafer bonding (or other similar transfer mechanisms) for eventual device fabrication. The "reverse recovery time" for an IGBT is significantly improved due to the optimized graded dopant in the so called "drift region" as well as at the interfaces of the drift region. Graded dopants can also be implemented in the $n^+$ buffer layer as well as other regions adjacent to the respective layers. Two important performance enhancements are the result of dopant gradients. For example, in an n-channel IGBT, electrons can be swept from source to drain rapidly, while at the same time holes can be recombined closer to the $n^+$ buffer layer. This can improve $t_{on}$ and $t_{off}$ in the same device.

As illustrated in FIGS. 5A, 5B, and 5C, donor gradient is also of benefit to very large scale integrated circuits (VLSI)—VLSI logic, DRAM, nonvolatile memory like NAND flash. Spurious minority carriers can be generated by clock switching in digital VLSI logic and memory ICs. These unwanted carriers can discharge dynamically-held "actively held high" nodes. In most cases, statically-held nodes (with $V_{cc}$) cannot be affected. Degradation of refresh time in DRAMs is one of the results, because the capacitor holds charge dynamically. Similarly, degradation of CMOS digital images in digital imaging ICs is another result of the havoc caused by minority carriers. Pixel and color resolution can be significantly enhanced in imaging ICs with the embodiments described herein. Creating "subterranean" recombination centers underneath the wells (gold doping, platinum doping) as is done in some high-voltage diodes is not practical for VLSI circuits. Hence, a novel technique is described herein which creates a drift field to sweep these unwanted minority carriers from the active circuitry at the surface into the substrate in a monolithic die as quickly as possible. In a preferred embodiment, the subterranean $n^-$ layer has a graded donor concentration to sweep the minority carriers deep into the substrate. One or more of such layers can also be implemented through wafer to wafer bonding or similar "transfer" mechanisms. This $n^-$ layer can be a deeply-implanted layer. It can also be an epitaxial layer. As desired, the $n^-$ well and $p^-$ wells can also be graded or retrograded in dopants to sweep those carriers away from the surface as well. The graded dopant can also be implemented in surface channel MOS devices to accelerate majority carriers towards the drain. To decrease programming time in nonvolatile memory devices, carriers should be accelerated towards the surface when programming of memory cells is executed. The graded dopant can also be used to fabricate superior Junction Field-Effect transistors where the "channel pinch-off" is controlled by a graded channel instead of a uniformly doped channel (as practiced in the prior art).

One of ordinary skill and familiarity in the art will recognize that the concepts taught herein can be customized and tailored to a particular application in many advantageous ways. For instance, minority carriers can be channeled to the surface to aid programming in nonvolatile memory devices (NOR, NAND, multivalued-cell). Moreover, single-well, and triple-well CMOS fabrication techniques can also be optimized to incorporate these embodiments individually and collectively. Any modifications of such embodiments (described here) fall within the spirit and scope of the invention. Hence, they fall within the scope of the claims described below.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A VLSI semiconductor device, comprising:
   a substrate of a first doping type at a first doping level having a surface;
   a first active region disposed adjacent the surface with a second doping type opposite in conductivity to the first doping type and within which transistors can be formed;
   a second active region separate from the first active region disposed adjacent to the first active region and within which transistors can be formed;
   transistors formed in at least one of the first active region or second active region;
   at least a portion of at least one of the first and second active regions having at least one graded dopant concentration to aid carrier movement from the first and second active regions towards an area of the substrate where there are no active regions; and
   at least one well region adjacent to the first or second active region containing at least one graded dopant region, the graded dopant region to aid carrier movement from the surface towards the area of the substrate where there are no active regions, wherein at least some of the transistors form digital logic of the VLSI semiconductor device.

2. The VLSI semiconductor device of claim 1, wherein the substrate is a p-type substrate.

3. The VLSI semiconductor device of claim 1, wherein the substrate has epitaxial silicon on top of a nonepitaxial substrate.

4. The VLSI semiconductor device of claim 1, wherein the first active region and second active region contain digital logic formed by one of either p-channel and n-channel devices.

5. The VLSI semiconductor device of claim 1, wherein the first active region and second active region contain either p-channel or n-channel devices in n–wells or p–wells, respectively, and each well has at least one graded dopant.

6. The VLSI semiconductor device of claim 1, wherein the first active region and second active region are each separated by at least one isolation region.

7. The VLSI semiconductor device of claim 1, wherein the graded dopant is fabricated with an ion implantation process.

8. The VLSI semiconductor device of claim 1, wherein the first and second active regions are formed adjacent the first surface of the substrate.

9. The VLSI semiconductor device of claim 1, wherein dopants of the graded dopant concentration in the first active region or the second active region are either p-type or n-type.

10. The VLSI semiconductor device of claim 1, wherein dopants of the graded dopant concentration in the first active region are both p-type and n-type.

11. The VLSI semiconductor device of claim 1, wherein dopants of the graded dopant concentration in the second active region are both p-type and n-type.

12. The VLSI semiconductor device of claim 1, wherein dopants of the graded dopant region in the well region are both p-type and n-type.

13. The VLSI semiconductor device of claim 1, wherein the transistors which can be formed in the first and second active regions are CMOS digital logic transistors requiring at least a source, a drain, a gate and a channel.

14. The VLSI semiconductor device of claim 1, wherein the device is a dynamic random access memory (DRAM).

15. The VLSI semiconductor device of claim 1, wherein the device is a complementary metal oxide semiconductor (CMOS) with a nonepitaxial substrate.

16. The VLSI semiconductor device of claim 1, wherein the device is a flash memory.

17. The VLSI semiconductor device of claim 1, wherein the device comprises digital logic and capacitors.

18. The VLSI semiconductor device of claim 1, wherein the device is central processing unit.

19. The VLSI semiconductor device of claim 1, wherein the device is an image sensor.

20. The VLSI semiconductor device of claim 1, wherein each of the first and second active regions are in the lateral or vertical direction.

21. A VLSI semiconductor device, comprising:
a substrate of a first doping type at a first doping level having a surface;
a first active region disposed adjacent the surface of the substrate with a second doping type opposite in conductivity to the first doping type and within which transistors can be formed in the surface thereof;
a second active region separate from the first active region disposed adjacent to the first active region and within which transistors can be formed in the surface thereof;
transistors formed in at least one of the first active region or second active region;
at least a portion of at least one of the first and second active regions having at least one graded dopant concentration to aid carrier movement from the surface to an area of the substrate where there are no active regions; and
at least one well region adjacent to the first or second active region containing at least one graded dopant region, the graded dopant region to aid carrier movement from the surface to the area of the substrate where there are no active regions, and wherein the graded dopant concentration is linear, quasilinear, error function, complementary error function, or any combination thereof.

22. The VLSI semiconductor device of claim 21, wherein the substrate is an n-type substrate.

23. The VLSI semiconductor device of claim 21, wherein the substrate is a p-type substrate.

24. The VLSI semiconductor device of claim 21, wherein the substrate has epitaxial silicon on top of a nonepitaxial substrate.

25. The VLSI semiconductor device of claim 21, wherein the first active region and second active region contain at least one of either p-channel and n-channel devices.

26. The VLSI semiconductor device of claim 21, wherein the first active region and second active region contain either p-channel or n-channel devices in n–wells or p–wells, respectively, and each well has at least one graded dopant.

27. The VLSI semiconductor device of claim 21, wherein the first active region and second active region are each separated by at least one isolation region.

28. The VLSI semiconductor device of claim 21, wherein dopants of the graded dopant concentration in the first active region or the second active region are either p-type or n-type.

29. The VLSI semiconductor device of claim 21, wherein dopants of the graded dopant concentration in the first active region are both p-type and n-type.

30. The VLSI semiconductor device of claim 21, wherein dopants of the graded dopant concentration in the second active region are both p-type and n-type.

31. The VLSI semiconductor device of claim 21, wherein dopants of the graded dopant region in the well region are both p-type and n-type.

32. The VLSI semiconductor device of claim 21, wherein the graded dopant is fabricated with an ion implantation process.

33. The VLSI semiconductor device of claim 21, wherein the substrate is a complementary metal oxide semiconductor (CMOS) device.

34. The VLSI semiconductor device of claim 21, wherein the device is a flash memory.

35. The VLSI semiconductor device of claim 21, wherein the device is a logic device with capacitors in at least some of the first or second active regions.

36. The VLSI semiconductor device of claim 21, wherein the device is central processing unit.

37. The VLSI semiconductor device of claim 21, wherein the device is an image sensor.

38. The VLSI semiconductor device of claim 21, wherein each of the first and second active regions are in the lateral or vertical direction.

39. A semiconductor device, comprising:
a substrate of a first doping type at a first doping level;
a first active region disposed adjacent to a surface of the substrate with a second doping type opposite in conductivity to the first doping type and within which transistors can be formed;
a second active region separate from the first active region disposed adjacent to the first active region and within which transistors can be formed;
transistors formed in at least one of the first active region or second active region; and at least a portion of at least one of the first and second active regions having at least one graded dopant concentration to aid carrier movement from the first or second active region to at least one substrate area where there is no active region.

40. The semiconductor device of claim 39 further comprising at least one well region adjacent to the first or second active region and containing at least one graded dopant region, the graded dopant region to aid carrier movement from any region in the well to the substrate area where there is no well.

41. A semiconductor device, comprising:
a substrate of a first doping type at a first doping level;
a first active region disposed adjacent to a surface of the substrate with a second doping type opposite in conductivity to the first doping type and within which transistors can be formed;
a second active region separate from the first active region disposed adjacent to the first active region and within which transistors can be formed;
transistors formed in at least one of the first active region or second active region; and
at least a portion of at least one of the first and second active regions having at least one graded dopant acceptor concentration to aid carrier movement from the first or second active region to at least one substrate area where there is no active region.

42. A semiconductor device, comprising:
a substrate of a first doping type at a first doping level;
a first active region disposed adjacent to a surface of the substrate with a second doping type opposite in conductivity to the first doping type and within which transistors can be formed;
a second active region separate from the first active region disposed adjacent to the first active region and within which transistors can be formed;
transistors formed in at least one of the first active region or second active region; and
at least a portion of at least one of the first and second active regions having at least one graded donor dopant concentration to aid carrier movement from the first or second active region to at least one substrate area where there is no active region.

43. A semiconductor device, comprising:
a substrate of a first doping type at a first doping level;
a first active region disposed adjacent to a surface of the substrate with a second doping type opposite in conductivity to the first doping type and within which transistors can be formed;
a second active region separate from the first active region disposed adjacent to the first active region and within which transistors can be formed;
transistors formed in at least one of the first active region or second active region; and
at least a portion of at least one of the first and second active regions having at least one graded acceptor dopant concentration and one graded donor dopant concentration to aid carrier movement from the first or second active region to at least one substrate area where there is no active region.

44. A CMOS Semiconductor device comprising:
a surface layer;
a substrate;
an active region including a source and a drain, disposed on one surface of the surface layer;
a single drift layer disposed between the other surface of the surface layer and the substrate, the drift layer having a graded concentration of dopants extending between the surface layer and the substrate, the drift layer further having a first static unidirectional electric drift field to aid the movement of carriers from the surface layer to an area of the substrate where there are no active regions; and
at least one well region disposed in the single drift layer, the well region having a graded concentration of dopants and a second static unidirectional electric drift field to aid the movement of carriers from the surface layer to the area of the substrate where there are no active regions.

* * * * *